United States Patent
Ahn

(10) Patent No.: US 8,679,585 B2
(45) Date of Patent: Mar. 25, 2014

(54) AMBIENT LITHOGRAPHIC METHOD USING ORGANOBORANE AMINE COMPLEXES

(75) Inventor: Dongchan Ahn, Midland, MI (US)

(73) Assignee: Dow Corning Corporation, Midland, MI (US)

(*) Notice: Subject to any disclaimer, the term of this patent is extended or adjusted under 35 U.S.C. 154(b) by 1681 days.

(21) Appl. No.: 11/992,373

(22) PCT Filed: Aug. 3, 2006

(86) PCT No.: PCT/US2006/030192
§ 371 (c)(1),
(2), (4) Date: Mar. 20, 2008

(87) PCT Pub. No.: WO2007/040794
PCT Pub. Date: Apr. 12, 2007

(65) Prior Publication Data
US 2010/0221429 A1    Sep. 2, 2010

Related U.S. Application Data

(60) Provisional application No. 60/719,296, filed on Sep. 21, 2005.

(51) Int. Cl.
*B05D 5/00* (2006.01)

(52) U.S. Cl.
USPC .......................................... 427/256; 427/340

(58) Field of Classification Search
USPC ........ 427/208.6, 207.1, 208.2, 256, 340, 287, 427/288
See application file for complete search history.

(56) References Cited

U.S. PATENT DOCUMENTS 2,409,633 A * 10/1946 Kropa ............................ 525/44
2,676,182 A    4/1954 Daudt et. al.
(Continued)

FOREIGN PATENT DOCUMENTS

EP    0 339 803 B1    1/1992
GB    1156653    7/1969
(Continued)

OTHER PUBLICATIONS

"Soft Lithography," Younan Xia and George M. Whitesides, Annual Reviews Material Science, 1998, 28, pp. 153-184.
(Continued)

*Primary Examiner* — Michael Cleveland
*Assistant Examiner* — Alex A Rolland
(74) *Attorney, Agent, or Firm* — Howard & Howard Attorneys PLLC

(57) ABSTRACT

A pattern is formed and developed on a surface with an ink system comprising (i) a free radical polymerizable monomer, oligomer or polymer, (ii) an organoborane amine complex, (iii) an amine reactive compound, and (iv) oxygen. Components (i)-(iv) are distributed between an ink and a developing medium. The ink formed on the surface in a pattern is developed by exposure of the ink to the developing medium. Component (iv) may be present as naturally occurring in the air. The method has the advantage of developing polymeric and polymer composite patterns rapidly in ambient air, without heating or irradiation. The ink system can be applied to inorganic and organic surfaces, and is particularly useful for polymeric surfaces such as low energy plastics. The composition can be applied to inorganic and organic surfaces, and is particularly useful for polymeric surfaces such as low energy plastics.

21 Claims, 1 Drawing Sheet

(56) References Cited

U.S. PATENT DOCUMENTS

| | | | |
|---|---|---|---|
| 2,985,633 A * | 5/1961 | Welch | 526/197 |
| 3,275,611 A | 9/1966 | Mottus et al. | |
| 4,584,355 A | 4/1986 | Blizzard et al. | |
| 4,585,836 A | 4/1986 | Homan et al. | |
| 4,690,967 A | 9/1987 | LaGarde et al. | |
| 4,699,966 A | 10/1987 | Harris et al. | |
| 5,106,928 A | 4/1992 | Skoultchi et al. | |
| 5,310,835 A | 5/1994 | Skoultchi et al. | |
| 5,380,527 A | 1/1995 | Legrow et al. | |
| 5,536,947 A | 7/1996 | Klersy et al. | |
| 5,539,070 A | 7/1996 | Zharov et al. | |
| 5,616,796 A | 4/1997 | Pocius et al. | |
| 5,684,102 A | 11/1997 | Pocius et al. | |
| 5,686,544 A | 11/1997 | Pocius | |
| 5,795,657 A | 8/1998 | Pocius et al. | |
| 5,852,140 A | 12/1998 | Georges et al. | |
| 5,872,197 A | 2/1999 | Deviny | |
| 5,902,919 A * | 5/1999 | Chen et al. | 585/520 |
| 5,929,194 A | 7/1999 | Woo et al. | |
| 5,990,036 A | 11/1999 | Deviny | |
| 6,008,308 A | 12/1999 | Pocius | |
| 6,121,165 A | 9/2000 | Mackey et al. | |
| 6,169,142 B1 | 1/2001 | Nakano et al. | |
| 6,248,846 B1 * | 6/2001 | Zharov et al. | 526/198 |
| 6,284,381 B1 | 9/2001 | Zharov et al. | |
| 6,361,716 B1 | 3/2002 | Kleyer et al. | |
| 6,380,301 B1 | 4/2002 | Enami et al. | |
| 6,433,057 B1 | 8/2002 | Bhagwagar et al. | |
| 6,509,423 B1 | 1/2003 | Zhu | |
| 6,513,897 B2 * | 2/2003 | Tokie | 347/15 |
| 6,521,431 B1 | 2/2003 | Kiser et al. | |
| 6,534,581 B1 | 3/2003 | Kleyer et al. | |
| 6,620,515 B2 | 9/2003 | Feng et al. | |
| 6,699,929 B2 | 3/2004 | Musa et al. | |
| 6,706,831 B2 | 3/2004 | Sonnenschein et al. | |
| 6,762,260 B2 | 7/2004 | Sonnenschein et al. | |
| 6,777,512 B1 | 8/2004 | Sonnenschein et al. | |
| 6,791,839 B2 | 9/2004 | Bhagwagar | |
| 6,806,330 B1 | 10/2004 | Sonnenschein et al. | |
| 6,825,398 B2 | 11/2004 | Wang et al. | |
| 2002/0025381 A1 | 2/2002 | Sonnenschein et al. | |
| 2002/0028894 A1 | 3/2002 | Sonnenschein et al. | |
| 2002/0033227 A1 | 3/2002 | Sonnenschein et al. | |
| 2002/0058764 A1 | 5/2002 | Sonnenschein et al. | |
| 2002/0182537 A1 | 12/2002 | Furukawa | |
| 2003/0064256 A1 | 4/2003 | Sadvary et al. | |
| 2003/0175333 A1 | 9/2003 | Shefer et al. | |
| 2004/0010099 A1 | 1/2004 | Kneafsey et al. | |
| 2004/0210015 A1 | 10/2004 | Sonnenschein et al. | |
| 2004/0242812 A1 | 12/2004 | Sonnenschein et al. | |
| 2007/0246245 A1 | 10/2007 | Ahn et al. | |
| 2007/0298223 A1 | 12/2007 | Loch et al. | |
| 2008/0050552 A1 | 2/2008 | Ahn et al. | |

FOREIGN PATENT DOCUMENTS

| | | |
|---|---|---|
| WO | WO 95/22567 | 8/1995 |
| WO | WO 01/44311 A1 | 6/2001 |
| WO | WO 2005/017005 A1 | 2/2005 |
| WO | WO 2005/017006 A1 | 2/2005 |
| WO | WO 2005/044867 A1 | 5/2005 |
| WO | WO2006088571 A1 | 8/2006 |

OTHER PUBLICATIONS

"Decal Transfer Microlithography: A New Soft-Lithographic Patterning Method," Williams R. Childs and Ralph G. Nuzzo, J. Am. Chem. Soc. 2002, 124, pp. 13583-13596.

"Dental Self-Curing Resin," Journal of Plastics Manufacture and Processing, Seiichiro Fujisawa, et. al., 1969, 3, pp. 64-71.

J. Org. Chem., 1980, 45, pp. 3571-3578, "Hydroboration. 56. Convenient and regiospecific Route to Functionalized Organosilanes Through the Hydroboration of Alkenylsilanes" Soderquist and Brown.

"Dispersion Polymerization in Supercritical Carbon Dioxide," J.M. DeSimone; E.E. Maury; Y.Z. Menceloglu; J.B. McClain; T.J. Romacki; J.R. Combes, JSTOR, vol. 265, No. 5170, Jul. 15, 1994, pp. 356-359.

"Suspension, emulsion, and dispersion polymerization: A methodological survey," R. Arshady, Colloid & Polymer Science, vol. 270; pp. 717-732 (1982).

\* cited by examiner

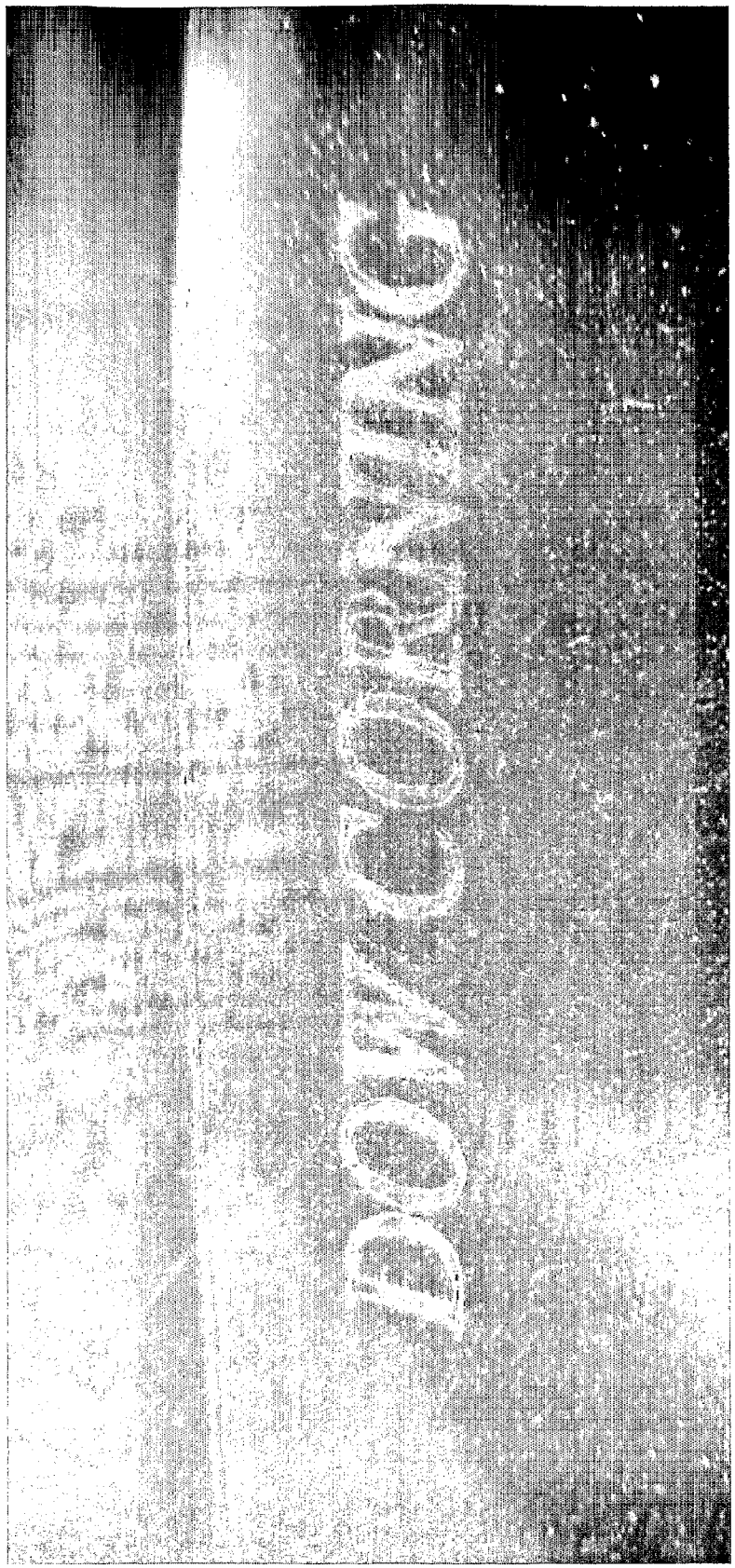

AMBIENT LITHOGRAPHIC METHOD USING ORGANOBORANE AMINE COMPLEXES

CROSS REFERENCE TO RELATED APPLICATIONS

This application is a U.S. national stage filing under 35 U.S.C. §371 of PCT Application No. PCT/US06/030192 filed on 3 Aug. 2006, currently pending, which claims the benefit of U.S. Provisional Patent Application No. 60/719,296 filed 21 Sep. 2005 under 35 U.S.C. §119 (e). PCT Application No. PCT/US06/030192 and U.S. Provisional Patent Application No. 60/719,296 are hereby incorporated by reference.

BACKGROUND OF THE INVENTION

Organoborane amine complexes are known. For example, organoborane amine complexes used for the bulk polymerization of acrylic monomers, are described in U.S. Pat. No. 3,275,611 (Sep. 27, 1966). Certain organoboron compounds such as trialkylboranes by themselves, however, are pyrophoric in the presence of oxygen, so preformed complexes between the organoboron compounds and amine compounds are required to have the benefit of imparting improved stability to organoboron compounds such as the trialkylboranes.

Recent modifications on the structure of organoborane amine complexes are also described in U.S. Pat. No. 6,706,831 (Mar. 16, 2004), and their use in acrylate based adhesives. The combination of alkylborane amine complexes with amine reactive decomplexing agents to initiate the polymerization of acrylic adhesives at room temperature, is also described in the '831 patent. Such compositions offer the advantage of rapid cure and adhesion to low energy surfaces.

This invention differs distinctly from the prior art of organoborane amine complexes in that it relates to a new use of organoborane amine based complexes used in an ink system for generating precise patterns of polymers or polymer composites on surfaces at low temperatures including room temperature and below. In this case, the ink system is defined as the medium or media used to generate a polymeric pattern, and is not limited to the common applications associated with non-reactive pigmented inks, such as those found in ballpoint pens. The ink system herein typically contains an ink and a developing medium. As used herein, the ink, as distinguished from the ink system, is defined as one or more components of the ink system that is transferred to the surface in the image of the pattern. The developing medium is the medium to which the ink is exposed to develop the pattern. The process of developing the pattern is defined as a process in which the pattern placed on the surface undergoes a net increase in number average molecular weight by polymerization and/or crosslinking. The ink system is differentiated from common inks in that it is reactive, and can be rapidly developed in ambient conditions. While the method described herein can be used to mark characters or patterns, as an alternative to writing, stamping, or labeling, on solid surfaces such as plastics, ceramics, glasses, metals, paper, or wood, it is also useful for creation of patterns with finer scale features such as those currently created by lithographic processes for microelectronics.

For example, most current microlithographic methods employ ultraviolet (UV), electron-beam (e-beam), ion beam, or x-ray irradiation to develop the pattern. These methods have limitations for developing in depth or in shadowed regions, and also require the presence of the appropriate radiation source and associated process infrastructure which can be quite costly. Other non-photochemical methods typically require heat to develop the pattern. In addition to being a mild, rapid, and robust ambient process, the method herein features the key advantage of working with a wide variety of surfaces. Further, the method herein uses an ink system that is shelf stable yet allows patterns to be developed rapidly under ambient conditions.

The invention utilizes alkylborane chemistry to present a unique, facile, and low cost method of developing patterns onto surfaces including low energy plastics, in ambient conditions, without the need for a radiation source such as UV or e-beam. The method allows a wide range of polymers and polymer composites to be created in images or topological patterns on various surfaces, for controlling properties such as surface texture, appearance, adhesion, release, paintability, cell adhesion, friction, protein adsorption, pH response, reactivity, and conductivity for electron, ion, photon, or phonon transport. The method is useful in applications including macroscopic printing or labeling, printing of electronic and other conductive circuits, and microlithography or nanolithography for electronics, such as fabrication of semiconductors, organic electronics and displays such as transistors and light emitting diodes, biological engineering such as tissue scaffolds, biological testing, microfluidics, catalysis and bio-catalysis, and imprinting of patterns or text onto various surfaces for security and loss prevention such as radio frequency identification tags. The method can alternatively be used to create templates for subsequent use in such applications.

BRIEF SUMMARY OF THE INVENTION

The invention relates to a method of developing a pattern on a surface. The method is carried out by placing and developing the pattern on the surface using an ink system containing (i) a free radical polymerizable monomer, oligomer or polymer, an (ii) an organoborane amine complex, (iii) an amine reactive compound, and (iv) oxygen. According to the method, the components of the ink system may be distributed in any proportion into a single package such as the ink, where the developing medium is air or other environment containing (iv) oxygen, or into a multiple package system such as an ink and a separately contained developing medium containing additional components of the ink system. For stability, it is preferred that components (ii) and (iii) are not intimately mixed with component (iv), i.e., air or other oxygen containing atmosphere, prior to developing the pattern.

In general, the method comprises placing the ink onto a surface in a desired pattern, and then exposing the ink to a developing medium to develop the pattern at low temperatures, such as below 100° C., including room temperature and below. Component (iv) may be present explicitly in the ink system, or component (iv) may be implicitly present in the environment, such as that naturally present in air. The ink system can be applied to any surface or combination of surfaces. These and other features of the invention will become apparent from a consideration of the detailed description.

BRIEF DESCRIPTION OF THE DRAWING

The single FIGURE of drawing is a photograph of a printed pattern polymerized onto a polypropylene surface according to Example 20.

DETAILED DESCRIPTION OF THE INVENTION

As noted above, the method according to the invention utilizes the versatility of organoborane chemistry, and more precisely, that afforded by organoborane amine complexes which are air stable, yet become extremely powerful free radical polymerization initiators when exposed to an amine reactive compound. This enables development virtually instantaneously, of a range of unsaturated monomers. By this method, the ink may be placed onto a surface by any number of well established methods, including pipetting, manual writing, rubber or elastomeric stamping, pad printing, screen printing, stencil printing, or ink jet printing, to rapidly develop patterns in ambient conditions onto a surface, upon exposure of the ink to an appropriate developing medium. The developing medium can be a liquid, a gas, a solid, or a mixture thereof.

Development occurs upon mixing of the components of the ink with the developing medium. The deposition of the ink pattern onto the surface may be physical, i.e., adsorption, or it may involve the formation of covalent bonds with the surface, i.e., grafting. As opposed to purely physical patterning methods where a dye, pigment, or a fully polymerized polymer is deposited, for example from a solvent which volatilizes to dry the ink, the present invention is a reactive process wherein the ink system during the development process undergoes an increase in average molecular weight via free radical polymerization, such as from a monomeric or macromonomeric fluid to a polymer film. In this respect, the present invention is similar to lithographic techniques based upon photopolymerization, but it does not require photoinitiators or a light source, and it offers numerous other advantages mentioned previously.

The essential components of the ink system are (i) the free radical polymerizable monomer, oligomer, or polymer, (ii) the organoborane amine complex, (iii) the amine reactive compound, and (iv) oxygen. In some cases, the same compound may be used for both (i) and (iii), as long as it has both essential functional groups as exemplified by acrylic acid or methacrylic acid. It should be noted that combinations of components (i)-(iv) can be distributed in any manner among an ink and developing medium. Preferably, components (ii) and (iii) are not intimately mixed together in the presence of (iv) oxygen prior to developing. Typically, component (iv) oxygen is inherently present in the form of air, but it may be deliberately excluded from or introduced to the ink, the developing medium, or the processing environment.

For example, in one embodiment, the method is carried out by forming the pattern on the surface with an ink comprising (i) a free radical polymerizable monomer, oligomer or polymer, and (ii) an organoborane amine complex, and then exposing the ink to the developing medium comprising (iii) an amine reactive compound, in the presence of (iv) oxygen, to develop the pattern on the surface.

In a second embodiment, the method is carried out by forming the pattern on the surface with an ink comprising (ii) an organoborane amine complex, and then exposing the ink to a developing medium containing (i) a free radical polymerizable monomer, oligomer or polymer and (iii) an amine reactive compound, in the presence of oxygen (iv), to develop the pattern on the surface.

In a third embodiment of the invention, the method is carried out by forming the pattern on the surface with an ink comprising component (iii) the amine reactive compound, then exposing the pattern to a developing medium containing components (i) and (ii) to develop the pattern on the surface in the presence of oxygen (iv). In this embodiment, the pattern may be placed on a surface either as an ink placed post-hoc, placed via a surface functionalization step such as selective priming, UV or corona treatment to create amine-reactive sites on the surface, or placed in-situ via a self assembly process during processing of the substrate in which component (iii) is present in the substrate either inherently or as an additive.

In a fourth embodiment of the invention wherein the ink system exists in a single package, the method is carried out by forming the pattern on the surface with an ink that contains (i) a free radical polymerizable monomer, oligomer or polymer, (ii) an organoborane amine complex, and (iii) an amine reactive compound in the absence of (iv) oxygen, and then exposing the composition to a developing medium comprising (iv) oxygen, to develop the pattern on the surface.

In a fifth embodiment of the invention, where the ink system exists in a single package, components (ii) and (iii) are isolated from one another by being present in separate phases of a multiphase system such as an emulsion, or via encapsulation of at least one of the components (ii) and (iii). Here, because components (ii) and (iii) are in separate phases, it is not necessary to store and process the ink in the absence of (iv) oxygen. The ink is placed onto the surface of in the desired pattern, then developed either by exposure to a developing medium comprising a chemical agent such as a de-emulsifier or solvent, or by exposure to a physical process such as shearing, irradiation, heating, cooling, pressurization, or depressurization, in a developing medium of (iv) oxygen, to cause components (ii) and (iii) to come into intimate contact with one another in the presence of (iv) oxygen.

In any of the embodiments of the invention, except where noted otherwise, components (i) and (iv) may be included with other optional components (v) in either the ink, or in the developing medium, or in both. Also, components (i) and (iii) in any embodiment may consist of a single component having both the required free-radical polymerizable group and an amine-reactive group.

The surface on which the ink system is used to develop patterns is not limited. Examples include glass surfaces, metal surfaces, quartz surfaces, ceramic surfaces, silicon surfaces, organic surfaces, rigid polymeric surfaces, flexible elastomeric surfaces, or composite surfaces thereof. The surface may also be a frozen liquid, such as ice or dry ice, to create freely standing templates or decals that may be transferred to another surface by allowing the surface to melt after the pattern has been created. The surface may also be a liquid surface, such as water, heptane, silicone oil, or mercury, provided the ink retains the desired features of the pattern until development is complete. Preferably, the ink does not spread or dissolve in the liquid surface when applied to the liquid surface. The resulting properties of the developed polymeric or composite pattern are not particularly limited. For example, the ink system can be formulated to yield a pattern that may be rigid, flexible, transparent, translucent, opaque, elastomeric, amorphous, semi-crystalline, liquid crystalline, thermoplastic, thermosetting, thermally or electrically insulating, thermally or electrically semi-conductive, or thermally or electrically conductive.

The ink may be placed or formed on the surface by any number of well established methods, including pipetting, manual writing, typewriting, gravure printing, engraving, thermography, rubber stamping, screen printing, pad printing, stencil printing, or ink jet printing. As with microlithographic methods, the pattern may be developed to yield either a positive or negative tone image for subsequent processing. The components used to form ink systems according to the invention include (i) a free radical polymerizable monomer, oligomer or polymer; (ii) an organoborane amine complex, (iii) an amine reactive compound, and (iii) oxygen. These components are set forth in more detail as follows.

The Free Radical Polymerizable Monomer, Oligomer, or Polymer (i)

Component (i) can be an organic compound, or an organometallic compound such as an organosilicon compound. In either case, it can be a single monomer, oligomer, or polymer containing unsaturation and capable of undergoing free radical polymerization. Mixtures of monomers, oligomers, and polymers can also be used. In many cases, it is preferred to use mixtures of monomer, oligomers, and polymers to impart the desired combination of physical properties such as viscosity, volatility, substrate wetting for processability and resolution in the uncured state, glass transition temperature, hardness or solubility, and surface properties such as hydrophilicity or hydrophobicity in the cured state. When component (i) is an organic compound, the selected compound will depend on the use of the cured product. Some suitable organic compounds are described in U.S. Pat. No. 6,762,260 (Jul. 13, 2004), including organic compounds such as 2-ethylhexylacrylate, 2-ethylhexylmethacrylate, methylacrylate, methylmethacrylate, neopentyl glycol diacrylate, neopentyl glycol dimethacrylate, glycidyl acrylate, glycidyl methacrylate, allyl acrylate, allyl methacrylate, stearyl acrylate, stearyl methacrylate, tetrahydrofurfuryl methacrylate, caprolactone acrylate, perfluorobutyl acrylate, perfluorobutyl methacrylate, 1H, 1H, 2H, 2H-heptadecafluorodecyl acrylate, 1H, 1H, 2H, 2H-heptadecafluorodecyl methacrylate, tetrahydroperfluoro acrylate, phenoxyethyl acrylate, phenoxyethyl methacrylate, bisphenol A acrylate, bisphenol A dimethacrylate, ethoxylated bisphenol A acrylate, ethoxylated bisphenol A methacrylate, hexafluoro bisphenol A diacrylate, hexafluoro bisphenol A dimethacrylate, diethylene glycol diacrylate, diethylene glycol dimethacrylate, dipropylene glycol diacrylate, dipropylene glycol dimethacrylate, polyethylene glycol diacrylate, polyethylene glycol dimethacrylate, polypropylene glycol diacrylate, polypropylene glycol dimethacrylate, trimethylolpropane triacrylate, trimethylolpropane trimethacrylate, ethoxylated trimethylolpropane triacrylate, ethoxylated trimethylolpropane trimethacrylate), pentaerythritol triacrylate, pentaerythritol trimethacrylate), pentaerythritol tetraacrylate, pentaerythritol tetramethacrylate, methyl-3-butenoate, allyl methyl carbonate, diallyl pyrocarbonate, allyl acetoacetate, diallyl carbonate, diallyl phthalate, dimethyl itaconate, diallyl carbonate, or combinations thereof. Other useful organic compounds include acrylate tipped polyurethane prepolymers prepared by reacting isocyanate reactive acrylate monomers, oligomers or polymers such as hydroxy acrylates with isocyanate functional prepolymers.

Also useful are a class of conductive monomers, dopants, oligomers, polymers, and macromonomers having an average of at least one free radical polymerizable group per molecule, and the ability to transport electrons, ions, holes, and/or phonons. For example, reference may be had to U.S. Pat. No. 5,929,194 (Jul. 27, 1999) that describes the preparation of various free radical polymerizable hole transporting compounds such as 4,4'4''-tris[N-(3(2-acryloyoxyethyloxy)phenyl)-N-phenylamino]triphenylamine, 4,4'4''-tris[N-(3(benzoyloxyphenyl)-N-phenylamino]triphenylamine, and preparation of electroluminescent devices made there from. It is noted that the acrylic functional group prefixes acryloyl- and acryl- are used interchangeably herein, as are the methacrylic functional group prefixes methacryloyl- and methacryl-.

When an organosilicon compound is used as component (i), again the selected compound depends on the use of the cured product. Generally, it comprises organosilanes or organopolysiloxanes having on average at least one free radical polymerizable moiety. The organosilicon compound can be monomeric, oligomeric, polymeric, or it can be a mixture of monomers, and/or oligomers, and/or polymers. Higher molecular weight species of such free radical polymerizable compounds are often referred to in the art as macromonomers. The organosilicon compounds can contain mono-functional or multi-functional units in the free radical polymerizable group. This allows for its polymerization to linear polymers, branched polymers of various architecture, copolymers of various architecture, or crosslinked polymeric networks. The monomers and oligomers can be any monomer or oligomer normally used to prepare addition or condensation curable polymers, or they can be monomers or oligomers used in other types of curing reactions, provided they contain at least one free radical polymerizable group.

Suitable organosilicon monomers include compounds having a structure generally corresponding to the formula $R''_n Si(OR''')_{4-n}$, where n is 0-4; and where at least one of the R'' or R''' groups contains a free radical polymerizable group. The R'' and R''' groups can be independently, hydrogen; a halogen atom; or an organic group including alkyl groups, haloalkyl groups, aryl groups, haloaryl groups, alkenyl groups, alkynyl groups, acrylate functional groups, and methacrylate functional groups. The R'' and R''' groups may also contain other organic functional groups including glycidyl groups, amine groups, ether groups, cyanate ester groups, isocyano groups, ester groups, carboxylic acid groups, carboxylate salt groups, succinate groups, anhydride groups, mercapto groups, sulfide groups, azide groups, phosphonate groups, phosphine groups, masked isocyano groups, and hydroxyl groups.

Representative examples of free radical polymerizable organosilicon monomers include compounds such as 3-methacryloxypropyltrimethoxysilane, 3-methacryloxymethyltrimethoxysilane, 3-methacryloxypropyltriethoxysilane, 3-acryloxypropyltrimethoxysilane, 3-acryloxymethyltrimethoxysilane, 3-methacryloxypropyltrimethylsilane, 3-acryloxypropyltriethoxysilane, 3-acryloxylpropyltrimethylsilane, vinyltrimethoxysilane, allyltrimethoxysilane, 1-hexenyltrimethoxysilane, tetra-(allyloxysilane), tetra-(3-butenyl-1-oxy)silane, tri-(3-butenyl-1-oxy)methylsilane, di-(3-butenyl-1-oxy)dimethylsilane, and 3-butenyl-1-oxy trimethylsilane. Other examples include di-alkoxyfunctional analogs of the trialkoxysilanes exemplified above, such as 3-methacryloxypropylmethyldimethoxysilane, monoalkoxyfunctional analogs of the above, such as 3-methacryloxypropyldimethylmethoxysilane. Also included within this class are halosilane precursors of these monomers, such as 3-methacryloxypropyltrichlorosilane, 3-methacryloxypropylmethyldichlorosilane, and 3-methacryloxypropyldimethylchlorosilane. The preferred free radical polymerizable moieties for these organosilicon compounds are aliphatic unsaturated groups in which the double bond is located at the terminal positions, internal positions, or both positions relative to the functional group. The most preferred free radical polymerizable moiety for the organosilicon compounds are acrylate groups or methacrylate groups.

When the free radical polymerizable organosilicon component is a monomer, oligomer, or polymer, the compound can be an organopolysiloxane having a linear, branched, hyperbranched, or resinous structure. The compound can be homopolymeric or copolymeric. The free radical polymerizable moiety for the organopolysiloxane can be an unsaturated organic group such as an alkenyl group having 2-12 carbon atoms, exemplified by the vinyl group, allyl group, butenyl group, or the hexenyl group. The unsaturated organic group can also comprise alkynyl groups having 2-12 carbon atoms, exemplified by the ethynyl group, propynyl group, or the butynyl group. The unsaturated organic group can bear the free radical polymerizable group on an oligomeric or polymeric polyether moiety such as an allyloxypoly(oxyalkylene) group or a halogen substituted analog thereof. The free radical polymerizable organic group can contain acrylate functional groups or methacrylate functional groups, exemplified by acryloxyalkyl groups such as acryloxymethyl and acryloxypropyl groups, and methacryloxyalkyl groups such as methacryloxymethyl and methacryloxypropyl groups. The unsaturated organic groups can be located at the terminal positions, pendant positions, or both the terminal and pendant positions relative to the polymer backbone. The preferred free radical polymerizable moiety for monomeric, oligomeric, and polymeric organosilicon compounds are acrylate groups and methacrylate groups.

Any remaining silicon bonded organic groups can be monovalent organic groups free of aliphatic unsaturation. The monovalent organic group can have 1-20 carbon atoms, preferably 1-10 carbon atoms, and is exemplified by alkyl groups such as methyl, ethyl, propyl, pentyl, octyl, undecyl, and octadecyl; cycloalkyl groups such as cyclohexyl; aryl groups such as phenyl, tolyl, xylyl, benzyl, and 2-phenylethyl; alkyloxypoly(oxylalkylene) groups such as propyloxypoly(oxyethylene), propyloxypoly(oxypropylene), propyloxy-poly(oxypropylene)-co-poly(oxyethylene) groups, halogen substituted analogs thereof; cyanofunctional groups including cyanoalkyl groups such as cyanoethyl and cyanopropyl; carbazole groups such as 3-(N-carbazolyl)propyl; arylamino-functional groups such as 4-(N,N-diphenylamino)phenyl-3-propyl; and halogenated hydrocarbon groups such as 3,3,3-trifluoropropyl, 3-chloropropyl, dichlorophenyl, and 6,6,6,5,5,4,4,3,3-nonafluorohexyl.

The free radical polymerizable organosilicon compound can vary in consistency from a fluid having a viscosity of 0.001 Pa·s at 25° C. to a gum. The free radical polymerizable organosilicon compound can also be a solid that becomes flowable at an elevated temperature or by the application of shear.

Component (i) includes organopolysiloxane fluids having the formulae:
(a) $R^1_3SiO(R^1_2SiO)_a(R^1R^2SiO)_bSiR^1_3$,
(b) $R^3_2R^4SiO(R^3_2SiO)_c(R^3R^4SiO)_dSiR^3_2R^4$, or
(c) combinations of such fluids.

In Formula (a), a has an average value of zero to 20,000, b has an average value of 1-20,000, c has an average value of zero to 20,000, and d has an average value of zero to 20,000. Each $R^1$ group is independently a monovalent organic group. The $R^2$ group is independently an unsaturated monovalent organic group. The $R^3$ groups can be the same as the $R^1$ groups. Each $R^4$ is independently an unsaturated organic group.

Suitable $R^1$ groups are monovalent organic groups including acrylic functional groups such as acryloxymethyl, acryloxypropyl, methacryloxymethyl, methacryloxypropyl groups; alkyl groups such as methyl, ethyl, propyl, and butyl groups; alkenyl groups such as vinyl, allyl, and butenyl groups; alkynyl groups such as ethynyl and propynyl groups; aromatic groups such as phenyl, tolyl, and xylyl groups; cyanoalkyl groups such as cyanomethyl, cyanoethyl and cyanopropyl groups; halogenated hydrocarbon groups such as 3,3,3-trifluoropropyl, 3-chloropropyl, dichlorophenyl, and 6,6,6,5,5,4,4,3,3-nonafluorohexyl groups; alkenyloxypoly(oxyalkyene) groups such as allyloxy(polyoxyethylene), allyloxypoly(oxypropylene), and allyloxy-poly(oxypropylene)-co-poly(oxyethylene) groups; alkyloxypoly(oxyalkyene) groups such as propyloxy(polyoxyethylene), propyloxypoly(oxypropylene), and propyloxy-poly(oxypropylene)-co-poly(oxyethylene) groups; halogen substituted alkyloxypoly(oxyalkyene) groups such as perfluoropropyloxy(polyoxyethylene), perfluoropropyloxypoly(oxypropylene), and perfluoropropyloxy-poly(oxypropylene)-co-poly(oxyethylene) groups; alkoxy groups such as methoxy, ethoxy, n-propoxy, isopropoxy, n-butoxy, and ethylhexyloxy groups; aminoalkyl groups such as 3-aminopropyl, 6-aminohexyl, 11-aminoundecyl, 3-(N-allylamino)propyl, N-(2-aminoethyl)-3-aminopropyl, N-(2-aminoethyl)-3-aminoisobutyl, p-aminophenyl, 2-ethylpyridine, and 3-propylpyrrole groups; epoxyalkyl groups such as 3-glycidoxypropyl, 2-(3,4,-epoxycyclohexyl)ethyl, and 5,6-epoxyhexyl groups; ester functional groups such as acetoxymethyl and benzoyloxypropyl groups; hydroxy functional groups such as hydroxy and 2-hydroxyethyl groups; isocyanate and masked isocyanate functional groups such as 3-isocyanatopropyl, tris-3-propylisocyanurate, propyl-t-butylcarbamate, and propylethylcarbamate groups; aldehyde functional groups such as undecanal and butyraldehyde groups; anhydride functional groups such as 3-propyl succinic anhydride and 3-propyl maleic anhydride groups; carboxylic acid functional groups such as 3-carboxypropyl and 2-carboxyethyl groups; carbazole groups such as 3-(N-carbazolyl)propyl; arylamino-functional groups such as 4-(N, N-diphenylamino)phenyl-3-propyl; and metal salts of carboxylic acids such as the zinc, sodium, or potassium salts of 3-carboxypropyl and 2-carboxyethyl.

The $R^2$ group is exemplified by alkenyl groups such as vinyl, allyl, and butenyl groups; alkynyl groups such as ethynyl and propynyl groups; and acrylic functional groups such as acryloxypropyl and methacryloxypropyl groups. As noted, the $R^3$ groups can be the same as the $R^1$ groups. The $R^4$ group is exemplified by alkenyl groups such as vinyl, allyl, and butenyl groups; alkynyl groups such as ethynyl and propynyl groups; alkenyloxypoly(oxyalkyene) groups such as allyloxy(polyoxyethylene), allyloxypoly(oxypropylene), and allyloxy-poly(oxypropylene)-co-poly(oxyethylene) groups; and acrylic functional groups such as acryloxymethyl, acryloxypropyl, methacryloxymethyl, and methacryloxypropyl groups.

Some representative organopolysiloxane fluids suitable for use as component (i) include α,ω-methacryloxypropyl-dimethylsilyl terminated polydimethylsiloxanes; .α,ω-methacryloxymethyl-dimethylsilyl terminated polydimethylsiloxanes; .α,ω-acryloxypropyl-dimethylsilyl terminated polydimethylsiloxanes; .α,ω-acryloxymethyl-dimethylsilyl terminated polydimethylsiloxanes; pendant acrylate functional polymers and methacrylate functional polymers such as poly(acryloxypropyl-methylsiloxy)-polydimethylsiloxane copolymers and poly(methacryloxypropyl-methylsiloxy)-polydimethylsiloxane copolymers; and telechelic polydimethylsiloxanes having multiple acrylate functional groups or methacrylate functional groups such as compositions formed via Michael addition of multi-acrylate monomers or multi-methacrylate monomers to amine terminated polydimethylsiloxanes. Such functionalizing reactions can be carried out a priori or in-situ.

It may be desirable to use a mixture of organopolysiloxane fluids differing in their degree of functionality and/or the nature of the free radical polymerizable group. For example, a much faster crosslinking efficiency and a reduced sol content can be obtained by using a tetra-functional telechelic polydimethylsiloxane prepared by the Michael addition reaction of N-(methyl)isobutyl-dimethylsilyl terminated polydimethylsiloxane with two molar equivalents of trimethylolpropane tri-acrylate as component (i) of the composition, relative to di-functional methacryloxypropyl-dimethylsilyl terminated polydimethylsiloxanes having a similar degree of polymerization (DP). However, the latter compositions also produce lower modulus elastomeric patterns. Hence, combinations of component (i) having differing structures may be quite useful. Methods for preparing such organopolysiloxane fluids are known and include the hydrolysis and condensation of the corresponding organohalosilanes or the equilibration of cyclic polydiorganosiloxanes.

Component (i) can be an organosiloxane resin including MQ resins containing $R^5_3SiO_{1/2}$ units and $SiO_{4/2}$ units; TD resins containing $R^5SiO_{3/2}$ units and $R^5_2SiO_{2/2}$ units; MT resins containing $R^5_3SiO_{1/2}$ units and $R^5SiO_{3/2}$ units; MTD resins containing $R^5_3SiO_{1/2}$ units, $R^5SiO_{3/2}$ units, and $R^5_2SiO_{2/2}$ units; or combinations thereof. Each $R^5$ group in these organosiloxane resins represents a monovalent organic group. The monovalent organic group $R^5$ can have 1-20 carbon atoms, preferably 1-10 carbon atoms.

Some examples of suitable monovalent organic groups representative of the $R^5$ group include acrylate functional groups such as acryloxyalkyl groups; methacrylate functional groups such as methacryloxyalkyl groups; cyanofunctional groups; and monovalent hydrocarbon groups. Monovalent hydrocarbon groups include alkyl groups such as methyl, ethyl, propyl, pentyl, octyl, undecyl, and octadecyl groups; cycloalkyl groups such as cyclohexyl groups; alkenyl groups such as vinyl, allyl, butenyl, and hexenyl groups; alkynyl groups such as ethynyl, propynyl, and butynyl groups; aryl groups such as phenyl, tolyl, xylyl, benzyl, and 2-phenylethyl groups; halogenated hydrocarbon groups such as 3,3,3-trifluoropropyl, 3-chloropropyl, dichlorophenyl, and 6,6,6,5,5,4,4,3,3-nonafluorohexyl groups; and cyano-functional groups including cyanoalkyl groups such as cyanoethyl and cyanopropyl groups.

The $R^5$ group can also comprise an alkyloxypoly(oxyalkyene) group such as propyloxy(polyoxyethylene), propyloxy-poly(oxypropylene) and propyloxy-poly(oxypropylene)-co-poly(oxyethylene) groups; halogen substituted alkyloxypoly (oxyalkyene) groups such as perfluoropropyloxy (polyoxyethylene), perfluoropropyloxypoly(oxypropylene) and perfluoropropyloxy-poly(oxypropylene)-co-poly(oxyethylene) groups; alkenyloxypoly(oxyalkyene) groups such as allyloxypoly(oxyethylene), allyloxypoly(oxypropylene) and allyloxy-poly(oxypropylene)-co-poly(oxyethylene) groups; alkoxy groups such as methoxy, ethoxy, n-propoxy, isopropoxy, n-butoxy and ethylhexyloxy groups; aminoalkyl groups such as 3-aminopropyl, 6-aminohexyl, 11-aminoundecyl, 3-(N-allylamino)propyl, N-(2-aminoethyl)-3-aminopropyl, N-(2-aminoethyl)-3-aminoisobutyl, p-aminophenyl, 2-ethylpyridine, and 3-propylpyrrole groups; hindered aminoalkyl groups such as tetramethylpiperidinyl oxypropyl groups; epoxyalkyl groups such as 3-glycidoxypropyl, 2-(3, 4,-epoxycyclohexyl)ethyl, and 5,6-epoxyhexyl groups; ester functional groups such as acetoxymethyl and benzoyloxypropyl groups; hydroxy functional groups such as hydroxy and 2-hydroxyethyl groups; isocyanate and masked isocyanate functional groups such as 3-isocyanatopropyl, tris-3-propyl-isocyanurate, propyl-t-butylcarbamate, and propylethylcarbamate groups; aldehyde functional groups such as undecanal and butyraldehyde groups; anhydride functional groups such as 3-propyl succinic anhydride and 3-propyl maleic anhydride groups; carboxylic acid functional groups such as 3-carboxypropyl, 2-carboxyethyl, and 10-carboxydecyl groups; carbazole groups such as 3-(N-carbazolyl)propyl; arylamino-functional groups such as 4-(N,N-diphenylamino) phenyl-3-propyl; and metal salts of carboxylic acids such as zinc, sodium, and potassium salts of 3-carboxypropyl and 2-carboxyethyl.

The organosiloxane resin can contain an average of 1-40 mole percent of free radical polymerizable groups such as unsaturated organic groups. The unsaturated organic groups may be an alkenyl group, alkynyl group, acrylate-functional group, methacrylate-functional group, or a combination of such groups. The mole percent of unsaturated organic groups in the organosiloxane resin is considered herein to be the ratio of (i) the number of moles of unsaturated groups containing siloxane units in the resin, to (ii) the total number of moles of siloxane units in the resin, times a factor of 100. Some specific examples of suitable organosiloxane resins that are useful as component (i) are $M^{Methacryloxymethyl}Q$ resins, $M^{Methacryloxypropyl}Q$ resins, $MT^{Methacryloxymethyl}T$ resins, $MT^{Methacryloxypropyl}T$ resins, $MD^{Methacryloxypropyl}T^{Phenyl}T$ resins, $MDT^{Methacryloxymethyl}T^{Phenyl}T$ resins, $M^{Vinyl}T^{Phenyl}$ resins, $TT^{Methacryloxymethyl}$ resins, $TT^{Methacryloxypropyl}$ resins, $T^{Phenyl}T^{Methacryloxymethyl}$ resins, $T^{Phenyl}T^{Methacryloxypropyl}$ resins, $TT^{Phenyl}T^{Methacryloxymethyl}$ resins, and $TT^{Phenyl}T^{Methacryloxypropyl}$ resins, where M, D, T, and Q have the same meanings as defined above.

Methods of preparing such organosiloxane resins are known including resins made by treating a resin copolymer produced by a silica hydrosol capping process, with an alkenyl containing endblocking reagent, as described in U.S. Pat. No. 2,676,182 (Apr. 20, 1954). This method involves reacting a silica hydrosol under acidic conditions with a hydrolyzable triorganosilane such as trimethylchlorosilane, a siloxane such as hexamethyldisiloxane, or a mixture thereof, followed by recovery of a copolymer having M and Q units. The copolymer typically contains about 2-5 percent by weight of hydroxyl groups. Organosiloxane resins containing less than 2 percent by weight of silicon bonded hydroxyl groups may then be prepared by reacting the copolymer with an endblocking agent containing unsaturated organic groups, and with an endblocking agent free of aliphatic unsaturation, in an amount sufficient to provide 3-30 mole percent of unsaturated organic groups in the product. Some suitable endblocking agents include silazanes, siloxanes, and silanes; and preferred endblocking agents are described in U.S. Pat. No. 4,584,355 (Apr. 22, 1986), U.S. Pat. No. 4,585,836 (Apr. 29, 1986), and U.S. Pat. No. 4,591,622 (May 22, 1986). A single endblocking agent or a mixture of endblocking agents may be used to prepare such organosiloxane resins.

Another type of organosilicon compound that can be used as component (i) is a composition formed by copolymerizing an organic compound having a polymeric backbone, with an organopolysiloxane, where an average of at least one free radical polymerizable group is incorporated per molecule. Some suitable organic compounds include hydrocarbon based polymers such as polyisobutylene, polybutadienes, and polyisoprenes; polyolefins such as polyethylene, polypropylene and polyethylene polypropylene copolymers; polystyrenes; styrene butadiene; and acrylonitrile butadiene styrene; polyacrylates; polyethers such as polyethylene oxide or polypropylene oxide; polyesters such as polyethylene terephthalate or polybutylene terephthalate; polyamides; polycarbonates; polyimides; polyureas; polymethacrylates; polythiophenes; polypyrroles; polyanilines; polyacetylene; polyphenylene vinylene; polyvinylpyridenes; and partially fluorinated or perfluorinated polymers such as polytetrafluoroethylene; fluorinated rubbers; terminally unsaturated hydrocarbons; olefins; and polyolefins. The organic compound can be a copolymer of any of these polymers, including polymers containing multiple organic functionality, multiple organopolysiloxane functionality, or combinations of organopolysiloxanes and organic compounds. The copolymeric structures can vary in the arrangement of repeating units from random, grafted, to being blocky in nature.

Component (i), in addition to bearing on average at least one free radical polymerizable group, may have a physical transition temperature, bear an organofunctional group with a physical transition temperature, or upon polymerization or crosslinking form particles that have a physical transition temperature, i.e., glass transition or melting transition, such that the composition undergoes changes marked by a softening or non-linear reduction in its viscosity on reaching certain temperatures under the conditions of use. Such materials are particularly useful for encapsulation of actives that are released by the introduction of heat. For example, an organopolysiloxane-based version of component (i) may be an organofunctional silicone wax. The wax can be an uncrosslinked organofunctional silicone wax, a crosslinked organofunctional silicone wax, or a combinations of waxes. Silicone waxes such as these are commercially available and are described in U.S. Pat. No. 6,620,515 (Sep. 16, 2003). When the organofunctional silicone wax bears at least one free radical polymerizable group such as an acrylate or methacrylate group, the wax is useful to impart phase changes when used as component (i). Component (i) can also comprise a mixture of any of the organic compounds, organosilicon compounds, and/or organopolysiloxane compounds described above.

Some representative and preferred examples of (i) include acrylic and methacrylic organic monomers, multifunctional monomers and macromonomers. Also, (meth)acrylic functional siloxane linear polymers, resins, and copolymers may also be included as component (i), and are particularly useful for tuning properties such as surface energy, modulus, thermal stability, moisture resistance, and hydrophobic balance.

The Organoborane Amine Complex (ii)

The organoborane amine complex (ii) is a complex formed between an organoborane, and a suitable amine compound that renders the complex stable at ambient conditions. The complex (ii) should be capable of initiating polymerization or crosslinking of component (i) by the introduction of an amine reactive compound and/or by heating. An example is an alkylborane amine complex formed from trialkylboranes and various amine compounds. Examples of trialkylboranes useful for forming component (ii) include trialkylboranes of the formula BR"$_3$ where R" represents linear and branched aliphatic or aromatic hydrocarbon groups containing 1-20 carbon atoms. Some examples include triethylborane, tri-n-butylborane, tri-n-octylborane, tri-sec-butylborane, tridodecylborane, and phenyldiethylborane.

Also useful as the organoborane component of the organoborane-amine complexes are a class of organosilicon functional boron compounds described in copending U.S. Patent application Ser. No. 60/641,353, filed on Jan. 4, 2005, entitled "Organosilicon Functional Boron Amine Catalyst Complexes and Curable Compositions Made Therefrom", and assigned to the same assignee as the present application. Generally, these compounds consist of a complex having an organosilicon functional organoborane portion containing at least one silicon atom, and the silicon atom is present in the organosilicon functional organoborane portion of the complex as a silicon atom containing group, a siloxane oligomer containing group, or as a siloxane polymer containing group. As set forth in the copending application, the organosilicon functional boron amine catalyst complexes therein are compounds having a formula:

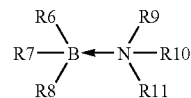

wherein B represents boron; R6, R7, and R8 are groups independently selected from the group consisting of hydrogen; a cycloalkyl group; a linear or branched alkyl group having 1-12 carbon atoms on the backbone; an alkylaryl group; an organosilane group; an organosiloxane group; an alkylene group capable of functioning as a covalent bridge to a boron atom; a divalent organosiloxane group capable of functioning as a covalent bridge to a boron atom; and halogen substituted homologues thereof; with the provisos that at least one of the R6, R7, or R8 groups contains one or more silicon atoms, and the silicon-containing group is covalently bonded to boron; R9, R10, and R11 are a group that yields an amine compound or a polyamine compound capable of complexing boron; and wherein two or more of the R6, R7, or R8 groups, and two or more of the R9, R10, or R11 groups, are such that they can combine to form heterocyclic structures, provided the sum of the number of atoms from the two combining groups does not exceed 11. Reference may be had to the copending application for additional detail if necessary.

Some examples of amine compounds useful to form the organoborane amine complex (ii) with the organoborane compounds include organic amine compounds such as 1,3 propane diamine, 1,6-hexanediamine, methoxypropylamine, pyridine, and isophorone diamine. Other examples of amine compounds useful to form organoborane amine complexes are described in U.S. Pat. No. 6,777,512 (Aug. 17, 2004), as well as in U.S. Pat. No. 6,806,330 (Oct. 19, 2004).

Silicon containing amine compounds can also be used to form the organoborane amine complex including aminosilanes such as 3-aminomethyltrimethoxysilane, 3-aminopropyltrimethoxysilane, 3-aminomethyltriethoxysilane, 3-aminopropyltriethoxysilane, 2-(trimethoxysilylethyl)pyridine, aminopropylsilanetriol, 3-(m-aminophenoxy)propyltrimethoxysilane, 3-aminopropyldiisopropylmethoxysilane, aminophenyltrimethoxysilane, 3-aminopropyltris(methoxyethoxethoxy)silane, N-(2-aminoethyl)-3-aminomethyltrimethoxysilane, N-(2-aminoethyl)-3-aminopropyltrimethoxysilane, N-(6-aminohexyl)aminomethyltrimethoxysilane, N-(2-aminoethyl)-11-aminoundecyltrimethoxysilane, (aminoethylaminomethyl)phenethyltrimethoxysilane, N-(2-aminoethyl)-3-aminopropylmethyldimethoxysilane, N-(2-aminoethyl)-3-aminoisobutylmethyldimethoxysilane, and (3-trimethoxysilylpropyl)diethylene-triamine.

Amine functional organopolysiloxanes are also useful for forming the organoborane amine complex (ii) including organosilicon compounds described above in formulas (a) and (b), and those compounds described previously as organopolysiloxane resins. This is subject to the stipulation that the molecule contain at least one amine functional group, such as 3-aminopropyl, aminomethyl, 2-aminoethyl, 6-aminohexyl, 11-aminoundecyl, 3-(N-allylamino)propyl, N-(2-aminoethyl)-3-aminopropyl, N-(2-aminoethyl)-3-aminoisobutyl, p-aminophenyl, 2-ethylpyridine, and 3-propylpyrrole.

Specific examples include terminal and/or pendant amine-functional polydimethylsiloxane oligomers and polymers, terminal and/or pendant amine-functional random, graft and block copolymers and co-oligomers of polydimethylsiloxane and poly(3,3,3 trifluoropropyl-methylsiloxane), terminal and/or pendant amine-functional random, graft and block copolymers and co-oligomers of polydimethylsiloxane and poly(6,6,6,5,5,4,4,3,3-nonfluorohexyl-methylsiloxane), and terminal and/or pendant amine-functional random, graft and block copolymers and co-oligomers of polydimethylsiloxane and polyphenymethylsiloxane. Other examples of useful compounds include resinous amine-functional siloxanes such as the amine-functional compounds described previously as organopolysiloxane resins, as well as amine-functional polysilsequioxanes.

Also useful to form the organoborane amine complex (ii) are other nitrogen containing compounds including N-(3-triethyoxysilylpropyl)-4,5-dihydroimidazole, ureidopropyltriethoxysilane, siloxanes of formulas similar to formulas (a) and (b) noted above, and those compounds described previously as organopolysiloxane resins in which at least one group is an imidazole, amidine, or ureido functional group. When the amine compound is polymeric, the molecular weight is not limited, except that it should be such as to maintain a sufficiently high concentration of boron to permit polymerization of the composition. For example, in a two-part ink system, the part containing the organoborane initiator may be diluted with the monomer and optionally, the active ingredient to be encapsulated, or it may consist of the initiator complex alone.

If desired, the ink system may be stabilized by physically or chemically attaching the organoborane amine complex to solid particles. This provides a way to control reaction times, as well as to stabilize liquid phase organoborane amine complexes against grossly separating from the rest of the composition during storage. For example, chemical attachment can be performed by pretreating solid particles such as ground silica, precipitated silica, calcium carbonate, or barium sulfate, with a condensation reactive compound containing an amine group such as aminopropyltrimethoxysilane. Although it is typically desirable to control the particle size and particle size distribution to impart the desired properties, the size of the particles is not inherently limited, and can range from discrete nanoparticles, i.e., nanometer diameter, to agglomerated or fused structures up to millimeter size. The pretreatment is followed by complexation with an organoborane compound, or by the direct treatment of the solid particles using a preformed organoborane amine complex that is condensation reactive. When the solid particles contain surface functional groups, additives such as surface treating agents or impurities that are inherently amine reactive, require appropriate pre-cautions to avoid premature decomplexation of the organoborane amine complex being attached. Solid particles containing amine reactive substances can be purified or neutralized before attachment of the organoborane amine complex. Alternatively, the attachment of the organoborane amine complex can be performed in an oxygen free environment.

Pre-attachment of component (ii) to monolithic, i.e., continuous rather than particulate, surfaces can be performed in the embodiment of the invention where component (ii) is pre-applied to a surface, followed by exposure to component (iii). For example, one may pre-attach an organoborane-amine complex having an alkoxysilyl group such as 3-aminopropyltriethoxysilane, complexed with an equimolar amount of triethylborane, to a surface such as gold or glass, by relying on the strong interaction or reactivity between the surface and the complex. The pre-attachment may be performed selectively in the image of the desired pattern, or as a general treatment or priming, provided at least one of the remaining components of the ink system is placed in the desired pattern. As described earlier, component (i) can be applied together with either component (ii) or component (iii), or both in this embodiment. To control the pattern formation and adhesion on the substrate, it may be desirable to use a combination of low and high surface energy alkylborane-amine complexes in the composition.

The Amine Reactive Compound Having Amine Reactive Groups (iii)

The polymerizable composition may contain an amine reactive compound (iii) that is capable of initiating the pattern development when mixed with the organoborane amine complex (ii) and exposed to an oxygenated environment. The amine reactive compound may be delivered as a liquid, gas, or solid. The amine reactive compound may be a small molecule, a monomer, an oligomer, a polymer, or a mixture thereof, may also be diluted or borne by a carrier such as an aqueous or non-aqueous solvent, or by a filler particle. The presence of component (iii) allows pattern development to occur rapidly at temperatures below the dissociation temperature of the organoborane amine complex (ii), including room temperature and below. To prevent pre-mature development in the presence of oxygen, it is preferred that components (ii) and (iii) be physically or chemically isolated, until just prior to the time when it is desirable to develop the pattern. For example, the composition may be prepared initially as two separate solutions that are combined into one, just prior to the initiation of development. The remaining components of the composition may be distributed in any manner between the two solutions, as long as (ii) and (iii) do not intimately contact each other in oxygen.

For example, a first solution, i.e., the ink herein, comprising components (i) and (ii), and a second solution comprising component (iii) are both air stable, but after the ink is deposited on a surface in a pattern, the pattern develops rapidly to solidify the pattern when the pattern is exposed to the second solution in ambient conditions. Alternatively, components (ii) and (iii) or both can be encapsulated, or delivered in separate phases. This can be accomplished by introducing one or both of the components (ii) and (iii) in a solid form, that prevents intimate mixing of components (ii) and (iii). Development of the pattern can be activated by (a) heating it above the softening temperature of the solid phase component or encapsulant, or (b) by the introduction of a solubilizing agent for the solid phase, that allows mixing of components (ii) and (iii).

Yet another method includes using a heterophase liquid solution such as an emulsion, in which components (ii) and (iii) are present in separate liquid phases that comprise the ink. The pattern may then be developed physically such as by shear or heating to break the emulsion, or chemically by exposing the pattern to a compound that causes components (ii) and (iii) to contact each other and react. Components (ii) and (iii) can also be combined in a single container without significant development, by packaging the two components in a container where mixing conditions are anaerobic. In this case, pattern development can be initiated by introduction of oxygen to the ink.

Examples of some amine reactive compounds having amine reactive groups (iii) that can rapidly initiate development of the ink in the presence of oxygen, include mineral acids, Lewis acids, carboxylic acids, carboxylic acid derivatives such as anhydrides and succinates, carboxylic acid metal salts, isocyanates, aldehydes, epoxides, acid chlorides, and sulphonyl chlorides. Some suitable amine reactive compounds include acrylic acid, methacrylic acid, polyacrylic acid, polymethacrylic acid, methacrylic anhydride, undecylenic acid, oleic acid, lauric acid, lauric anhydride, citraconic anhydride, ascorbic acid (Vitamin C), isophorone diisocyanate monomers or oligomers, methacryloylisocyanate, 2-(methacryloyloxy)ethyl acetoacetate, undecylenic aldehyde, and dodecyl succinic anhydride.

The amine reactive compound may be an organosilicon or an organopolysiloxane bearing amine reactive groups. Some examples include organosilanes such as 3-isocyanatopropyltrimethoxysilane, 3-isocyanatomethyltrimethoxysilane, and 3-glycidoxypropyltrimethoxysilane. Other organosilicon compounds bearing amine reactive groups that can be used include triethoxysilylpropyl succinic anhydride; propylsuccinic anhydride functionalized linear, branched, resinous, and hyperbranched organopolysiloxanes; methylsuccinic anhydride functionalized linear, branched, resinous, and hyperbranched organopolysiloxanes; cyclohexenyl anhydride functional linear, resinous, and hyperbranched organopolysiloxanes; carboxylic acid functionalized linear, branched, resinous, and hyperbranched organopolysiloxanes such as carboxydecyl terminated oligomeric or polymeric polydimethylsiloxanes; and aldehyde functionalized linear, branched, resinous, and hyperbranched organopolysiloxanes such as undecylenic aldehyde-terminated oligomeric or polymeric polydimethylsiloxanes.

The '512 patent describes silicon containing compounds that can be used as component (iii) including certain compounds that release an acid when exposed to moisture. The '512 patent also describes other amine reactive compounds referred to as decomplexation agents that can be used as component (iii).

Although a notable advantage of this technique is rapid ambient development without the need for a radiation source, the composition may be used to create patterns using existing radiative processes such as under a UV or e-beam source, to accelerate reaction, enable curing in shadowed regions or in deep sections, or to impart improved adhesion to the substrate. In such cases, it may be useful to include compounds capable of generating amine reactive groups when exposed to ultraviolet radiation such as a photoacid generator. Some examples of such compounds include iodonium salts containing $[SbF_6]^-$ counterions. In such an embodiment, it may be useful to optionally include a photosensitizing compound such as isopropylthioxanthone.

In some cases, it may be desirable to attach the amine reactive compound to solid particles. Solid particles may have properties such as electrical conductivity or thermal conductivity, or ferroelectric properties, that can render the resulting pattern, more useful for subsequent applications. Attachment of the amine-reactive groups can be accomplished by a number of known surface treatments either in-situ or a priori. Some surface treatment methods include, for example, pre-treating solid particles such as ground or precipitated silica, calcium carbonate, carbon black, carbon nanoparticles, silicon nanoparticles, barium sulfate, titanium dioxide, aluminum oxide, boron nitride, silver, gold, platinum, palladium, and alloys thereof; or a base metal such as nickel, aluminum, copper, and steel; with a condensation reactive compound. This is followed by reaction of the pre-treated solid particles with a compound having amine reactive groups, or by the direct treatment of the pre-treated solid particles using amine reactive compounds that have hydrolyzable moieties. In such cases, it is preferred that the particles to which the amine reactive compounds are attached have a similar density to the polymerization medium to facilitate dispersion of the particles in the ink system.

Some examples of condensation reactive compounds that can be used for attachment, include isocyanatomethyltriethoxysilane, isocyanatopropyltriethoxysilane, isocyanatomethyltrimethoxysilane, isocyanatopropyltrimethoxysilane, triethoxysilylundecanal, glycidoxymethyltrimethoxysilane, glycidoxypropyltrimethoxysilane, 3-(triethoxysilyl)methylsuccinic anhydride, 3-(triethoxysilyl)propylsuccinic anhydride, and 2-(4-chlorosulfonylphenyl)ethyltrimethoxysilane. Attachment of the amine reactive compound to the solid particles can also be accomplished by mixing an acid functional compound with fillers having the appropriate surface functionality, under conditions conducive to formation of an acid base complex, a hydrogen bonded complex, or an acid salt.

Some particulate fillers are commercially available that are pre-treated with surface treating agents referred to as lubricants, or that can be obtained with impurities that contain amine reactive groups, such as carboxylic acid. In this way, component (iii) and an optional component, can be delivered together in the form of a treated filler. The advantage obtained in that instance, is that the reaction between the organoborane amine complex and the amine reactive groups on the filler, can help remove the lubricant from the surface of the filler particles. The lubricant is necessary for stability of the particle in concentrated form, but it can interfere with the intended function of the filler. The reaction of component (ii) and the amine-reactive lubricant can effectively remove the lubricant from the particle surface, thereby activating the particle. A typical example is a fatty-acid treated silver filler particle, wherein the fatty acid lubricant interferes with particle-to-particle contact, which is needed for establishing electrical conductivity in a final form.

It may also be advantageous for the sake of stability, to use a combination of fillers containing amine reactive groups, and fillers that are inert with respect to amine compounds. For example, when components (ii) and (iii) are maintained in separate solutions, the filler that is inert with respect to amine compounds, can be combined with the alkylborane amine complex (ii), while the filler bearing amine reactive groups, can be packaged in a separate container from component (ii). In that case, component (i) could be included with any part of the formulation, or with more than one part. Alternatively, the amine reactive compound (iii) can be introduced under conditions that allow it to be delivered in the gas phase to the reaction vessel containing the remainder of the composition.

Pre-attachment of component (iii) to monolithic, i.e., continuous rather than particulate, surfaces can be performed in the embodiment of the invention where component (iii) is pre-applied to a surface, followed by exposure to component (ii). For example, one may pre-attach an amine-reactive compound having an alkoxysilyl group such as 3-isocyanopropyl trimethoxysilane, to a surface such as gold or glass, by relying on the strong interaction or reactivity between the surface and the complex. The pre-attachment may be carried out selectively in the desired pattern, or as a general treatment or priming, provided at least one of the remaining components of the ink system is placed in the desired pattern. As described previously, component (i) can be applied together with either component (ii) or with component (iii), or both in this instance. To control the pattern formation and adhesion on the substrate, it may be desirable to use a combination of low and high surface energy amine-reactive compounds in the ink system.

Some representative and preferred examples of amine reactive groups useful (iii) include carboxylic acid, anhydride, isocyanate, aldehydes, and epoxies. Blocked isocyanates may be useful in cases where instead of ambient polymerization, it is desirable to use heat to initiate polymerization rapidly.

Oxygen (iv)

Oxygen may be present in any diluted, dissolved, or pure form, and may be implicitly present in the form of atmospheric air, or explicitly introduced to the ink system or processing environment. Although it is not typically necessary, it may be desirable in some cases to increase, reduce, or eliminate naturally occurring oxygen content in either the ink, or in the developing medium, or in components (i), (ii), or (iii) thereof, by controlling pressure and/or quality of the atmosphere in which the components are stored, and in which the method of the invention is carried out. Explicit control of the oxygen content may be carried out by any number of known methods, including controlling the pressures of various types of gases including oxygen, compressed air, oxygen-enriched air, argon, nitrogen, helium and, and/or the inclusion of an oxygen scavenging, oxygen storing, oxygen generating, and/or oxygen releasing substance. Oxygen for purposes herein includes all isotopes of oxygen. Oxygen may be introduced as a gas, a liquid, or a solid, but preferably in introduced in the gas phase. Most preferably, the source of oxygen is air.

Optional Components (v)

One or more optional components can be included in the ink systems herein such as dyes; pigments; surfactants; water; wetting agents; solvents including common organic aqueous solvents, ionic liquids, and supercritical fluids; diluents; plasticizers; polymers; oligomers; rheology modifiers; adhesion promoters; crosslinking agents; combinations of polymers, crosslinking agents, and catalysts useful for providing a secondary cure of the pattern; polymers capable of extending, softening, reinforcing, toughening, modifying viscosity, or reducing volatility when mixed into the composition; extending and reinforcing fillers; conductive fillers, spacers; dopants; quantum dots such as nanoparticles of cadmium selenide; comonomers such as organic acrylates and organic methacrylates; UV stabilizers; aziridine stabilizers; void reducing agents; cure modifiers such as hydroquinone and hindered amines; free radical initiators such as organic peroxides and ozonides; acid acceptors; antioxidants; oxygen scavengers; oxygen sponges; oxygen releasing agents; oxygen generators; heat stabilizers; flame retardants; silylating agents; foam stabilizers; fluxing agents; and dessicants.

Surfaces

The surface of the substrate on which the patterns are developed is not limited. Although the substrate may be solid or liquid under the conditions of use, in many cases it is desirable to develop patterns directly onto surfaces of solid substrates. Composite articles according to the invention are typically curable compositions that can be disposed or applied to a single substrate or between multiple substrates. The substrate or substrates can be organic, thermoplastic, thermosetting, metallic, ceramic, or other suitable inorganic material. The substrates can be multi-layered substrates, such as substrates used in printed circuit boards, in which improved adhesion is desired between the curable pattern and the substrate or substrates of the composite article. Some specific examples of substrates include silicon, silica, alumina, cerium oxide, glass, gold, platinum, palladium, rhodium, silver, steel, stainless steel, anodized steel, aluminum, anodized aluminum, cast aluminum, titanium, nickel, copper, brass, and oxides thereof; circuit boards; polyethylene, polypropylene, polystyrene, syndiotatic-polystyrene, polybutylene terephthalate, polycarbonate, polyphthalamide; polyphenylene sulfide; epoxy resins; bis-maleimide triazine resins; fluoropolymers such as polytetrafluoroethylene, natural rubber, latex rubbers, silicone, fluorosilicone, pressure sensitive tapes and adhesives; and cellulosic polymers such as wood, paper, and other natural polymers.

In cases where it is desirable to form freely standing patterns such as for transfer as decals, one may apply the ink onto the surface of substrates that are meltable or sublimable solids such as ice or dry ice, or liquid substrate surfaces such water, oil, or liquid organopolysiloxane, provided the surface does not dissolve the desired pattern, or otherwise impair development of the desired pattern. In these instances, it may be convenient to introduce component (iii) of the ink system by imbibing it into the substrate, as exemplified by dissolving of acrylic acid or polyacrylic acid into water or ice.

Method

As discussed previously, the composition described above may be assembled in several combinations, and applied in a number of ways to create a polymeric pattern on a surface. In general, an ink system containing components (i), (ii) and (iv) is used to develop a pattern onto a surface. In the embodiments where the ink system exists as a two package system, components (ii) and (iii) are isolated from one another, until after the pattern has been deposited on the surface. The pattern is then developed in place upon exposure of components (ii) and (iii) to each other in the presence of (iv) oxygen, without the need for heating or radiation. In the embodiment where the ink system is present as a one package system, components (i), (ii) and (iii) are combined together to form an ink that is deposited in a pattern onto a surface, all in an environment free of (iv) oxygen. The pattern is then developed by exposure of the pattern to an environment containing (iv) oxygen such as air. In another embodiment, where the ink system exists as a single package system, components (ii) and (iii) are isolated from one another by being present in separate phases of a multiphase system such as an emulsion, or via encapsulation of at least one of the components (ii) and (iii). The ink pattern is placed onto the surface of interest, then developed by exposure to either a chemical agent such as an de-emulsifier or solvent, or physical processes such as shearing, irradiation, heating, cooling, pressurization, or depressurization, to cause components (ii) and (iii) to come into contact with one another, in the presence of (iv) oxygen.

For example, in the first embodiment, an ink comprising components (i) and (ii) is deposited in a pattern onto the surface of interest. The method of deposition may be as simple as hand-lettering with a brush or a fine-tipped applicator, or for finer resolution, it can be transferred via a rubber stamp wetted with the ink, stencil or screen printed, or printed out of an inkjet printer with a cartridge filled with the ink. The resulting pattern is then developed by exposing to an environment rich in component (iii), such as by dipping in a bath of component (iii), by passing through a chamber in which the vapor space contains component (iii), by passing through a fluidized bed of solid particles bearing component (iii), or by overprinting the pattern with an inkjet printer having a cartridge filled with a solution containing component (iii), in the presence of component (iv), or followed by exposure to component (iv). In such multi-package systems, the method of exposing the pattern to the second solution may be done in several ways such as via immersion of the entire substrate, by dipping in a bath, exposing to a vapor chamber, or selectively as in over-spraying the pattern from a second inkjet cartridge containing the second component. It may be convenient to use an inkjet printing cartridge with separate reservoirs, as exemplified by a multi-colored inkjet cartridge, or two separate cartridges on a single printer carriage, to store separately the ink and developing medium, and to allow application and development of the pattern, simply by mixing the components in the process of inkjet printing.

Organoborane-amine complexes that are stable in ambient air can dissociate at elevated temperatures without requiring component (iii). Upon exposure to component (iv), these thermally dissociated organoborane-amine complexes are capable of initiating free radical polymerization and crosslinking. While component (iii) is required for rapid development of the pattern at low temperatures including room temperature and below, a key advantage of this invention, it can also be inferred that air stable one package ink systems containing components (i) and (ii), but not component (iii), may be used to develop polymeric and polymer composite patterns at high temperatures in air, or in other environments containing component (iv), without requiring component (iii).

Alternative methods to photolithography for creating micron-sized patterns and sub-micron sized patterns have recently emerged under the general class of techniques known as soft lithography, in which an elastomeric stamp or mold is used to transfer a pattern having some functionality which is subsequently derivatized to develop the pattern. Reference may be had, for example to the *Annual Review of Materials Science*, Volume 28, Pages 153-184, (1998). There are also many embodiments of soft lithography such as micro-contact printing, replica molding, micro-transfer molding, phase shift photolithography, and decal transfer lithography. Reference may be had, for example to the *Journal of the American Chemical Society*, Volume 124, Number 45, Pages 1385-13596, (Oct. 19, 2002). However, none use alkylborane-amine complexes in the development of the pattern, and therefore do not have the advantages of alkylborane-based free radical chemistry, that enables simple, rapid pattern development under ambient conditions, and adhesion to low energy substrates. The method described herein can be applied with known soft lithographic techniques to create micron and sub-micron scale patterns of polymers and polymeric composites directly onto surfaces. The method can also be used to create a master template, and alkylborane-based chemistries described for example in copending U.S. Patent application Ser. No. 60/641,360, filed on Jan. 4, 2005, entitled "Siloxanes and Silanes Cured by Organoborane Amine Complexes", and assigned to the same assignee as the present application, can be used to cure elastomeric organosiloxane materials, or the elastomeric stamp itself under ambient conditions.

Processing

Because the components of the ink system may be distributed in various manners in the several embodiments, the relative amounts of the components can vary widely. For example, in multiple package ink systems, the developing medium may contain a large excess of components to allow multiple samples of a pattern, comprising the remaining components of the ink system and the surface to be developed by passing through the developing medium in a continuous or semi-continuous process. However, the amount of the developing medium needed to develop just one pattern may be hundreds of times smaller. In a single package ink system, the following range of concentrations may be used to develop patterns.

A. 0.1-50 parts by weight of the free radical polymerizable organosilicon monomer, oligomer or polymer (i);
B. 0.1-50 parts by weight of the organoborane amine complex (ii), sufficient to cure the composition, the amount depending on the molecular weight of the complex and the number of boron atoms per molecule;
C. 0.1 to 50 parts by weight of the amine reactive compound (iii);
D. 0.0001 to infinite parts by weight of oxygen (iv); and
E. 0 to 50 parts by weight of the optional ingredient (v) or ingredients (v); based on the total weight of the composition. In any case, the system may be scaled to accommodate any convenient mass or volume. The range of component (iv) is essentially unlimited, since oxygen (iv) can be present in any environment such as air.

The development rate of the ink system can be controlled by introducing additional amine compounds, to increase the molar ratio of amine groups to boron atoms in the ink. The effective amount to be added, depends on the amine:boron ratio used in component (ii). It is preferred that the overall amine:boron ratio remain sufficiently low, however, to permit development to occur. A suitable amine:boron ratio would be less than 10:1, preferably less than 4:1. When the amine reactive component is already present in the ink system, i.e., when residual carboxylic acid is present on the filler particles, higher levels of amine compounds should be added to neutralize or partially neutralize the amine reactive groups, to reduce the development rate. The amine compound may contain monofunctional or multifunctional amine groups, and it can be a primary amine, a secondary amine, and/or a tertiary amine. If desired, the amine compound can contain free radical polymerizable groups, or another functional group such as a hydrolyzable group. The amine compound can be monomeric, oligomeric, or polymeric in nature. Amine groups on the compound may be borne on an organic, organosilicon, or organopolysiloxane compound.

Uses and Applications

The invention can be used in most applications of macrolithography, microlithography, nanolithography, permanent inks, swellable inks, and conductive inks. Applications are wide and versatile, ranging from texturing of surfaces, for creating master templates or master stamps for subsequent patterning, for creating gradient patterns for high throughput assays, micro-fluidics, tissue scaffolding, biological assaying, and diagnostics. Also included are applications in forensics, security and loss prevention such as radio frequency identification tags and labels, and biotechnology such as enzyme immobilization. The ensuing developed pattern may be used directly, or subjected to post-processing or reaction steps as a template. In particular, the developed patterns can be used to render a surface pattern selectively receptive to subsequent chemical grafting, binding dyeing, or pigmentation. As an example, the method can be used to selectively prime polyolefins for subsequent reaction over the pattern, as in painting of raised lettering as an alternative to decals, in which case it can be carried out by simply dipping a substrate previously subjected to the process of this invention into a paint, or by spray painting the entire surface, and then simply wiping or rinsing off the paint to remove it from the unpatterned areas. The pattern may be discrete, continuous, or semi-continuous. The pattern may project from the original surface. In some cases, applied pressure or heat from the development can be used to etch the pattern below the level of the original surface, as in burning of images into cellulosic substrates in wood burning via the method of the invention. An inverse pattern may also be formed by pouring the ink over a solid pattern such as a circuit board, and then exposing it to the developing medium. Upon removal from the substrate, the image of the solid pattern will appear as depressions within the continuous layer of the developed ink. Such a material could then be used, for example, as a stamp for lithography.

EXAMPLES

The following examples are set forth in order to illustrate the invention in more detail. Unless otherwise specified, number average molecular weight (Mn) for organopolysiloxane polymers and resins are values measured by gel permeation chromatography using polystyrene calibration standards. The polydispersity indices for samples analyzed by Gel Permeation Chromatography (GPC) ranged from 1.2-2.2, unless specifically noted otherwise. In all of the following examples, except where it is noted that an argon glove box was used, the level of component (iv) oxygen was not controlled, and it was implicitly present in abundance in the ambient air of the environment in which the examples were conducted, as well as being present to a much lesser extent as naturally dissolved in the components during their storage and handling.

Example 1

An ink was prepared using a catalyst of triethylborane complexed with an equimolar amount of 1,3-propanediamine. The composition was transferred in a text pattern onto an untreated 1"×3"×0.25" virgin Poly-Hi stress relieved polypropylene substrate marketed by Boedeker Plastics, Inc., Shiner, Tex., using a rubber stamp having a pattern of English block letters and numerals that had been dipped in the ink, then applied by hand pressure to the substrate surface. The letter M for example was about 2 mm wide by 2.22 mm in height. The text pattern was then developed immediately afterward by dipping the substrate into a 250 ml Pyrex™ beaker of acrylic acid for approximately 1-2 seconds, then removing it to expose it to air. In this example, acrylic acid served as both components (i) and (iii). It functioned as a free radical polymerizable compound with unsaturation as well as the amine-reactive compound. When the substrate was removed from the solution to ambient air, the lettering on the rubber stamp was polymerized onto the polypropylene surface. The developed pattern was a solid that could be detected by the fingers as raised lettering. The developed pattern remained unchanged by washing in heptane, providing evidence that the pattern was indeed polymerized onto the surface.

Example 2

Example 1 was repeated except that an electroplated gold coated copper substrate was used instead of the polypropylene surface. When the substrate was removed from the solution to ambient air, the lettering on the rubber stamp was polymerized onto the gold-coated copper surface. The procedure was repeated with a copper substrate, the backside of which was a copper clad FR-4 panel from Laird Plastics, West Palm Beach, Fla.; a 304 stainless steel substrate, Type SS-34 from Q-Panel Lab Products, Cleveland, Ohio; a 1/32" thick virgin polytetrafluoroethylene film from Exotic Rubber & Plastics Corporation, Freeland, Mich.; and a hydrocarbon oil contaminated polypropylene substrate from Boedeker Plastics, Inc., Shiner, Tex.; respectively. In each instance, the lettering on the rubber stamp was polymerized onto the copper substrate, the stainless steel substrate, and the oily polypropylene substrate. The developed patterns were solids that could be detected by the fingers as raised lettering. The developed pattern remained unchanged by washing in heptane, providing evidence that the pattern was indeed polymerized onto the surface. Because alkylborane initiated materials are capable of adhering to a range of substrates, Examples 1 and 2 demonstrate that the method of the invention allows patterning even onto difficult substrates, including low energy plastics such as polyolefins, metals and oil-contaminated surfaces.

Example 3

A fine tipped plastic disposable pipette was used to handwrite the letters AB onto a Fisher 12-550-11 glass slide using an ink prepared from equal weight parts by weight of an organopolysiloxane resin having the nominal structure $M_{0.3}T^{Methacryloxypropyl}_{0.2}T^{Phenyl}_{0.5}$, an Mn of 1,030 g/mol, and an Mw of 1,200 g/mol as component (i), and a triethylborane complexed with 1.5 molar equivalents of 3-aminopropyltriethoxysilane as component (ii). Upon dipping the glass slide into a 250 ml beaker containing an excess of acrylic acid, and removing the substrate from the solution to ambient air, the letters AB were clearly polymerized onto the surface of the glass slide. M and T are as defined above.

Example 4

A composition similar to the composition in Example 3 was used, except that the ink contained only the catalyst component (ii), while the beaker containing the acrylic acid also contained a mass of the same siloxane resin used as component (i) in Example 3, equal to the mass of acrylic acid. A fine tipped plastic disposable pipette was used to handwrite the letters AB onto a glass slide using the ink containing only the catalyst component (ii). Upon dipping the glass slide into a beaker containing the mixture of acrylic acid and component (i), and removing the substrate from the solution to ambient air, the letters AB were clearly polymerized onto the surface of the glass slide.

Example 5

A fine tipped plastic disposable pipette was used to handwrite the letters AB onto a glass slide using an ink consisting of the same catalyst component (ii) used in Examples 3 and 4. Upon dipping the glass slide into a 20 ml Pyrex™ beaker containing a mixture of 3.7 parts of an oganopolysiloxane resin having the nominal formula $M_{0.2}D_{0.2}T^{Methacryloxyppyl}_{0.3}T_{0.3}$, and an Mn of 1,340 g/mol, as component (i), and 3.1 parts of carboxydecyldimethylsilyl terminated polydimethylsiloxane having an Mn of 1,412 g/mol as component (iii), and removing the substrate from the solution to ambient air, the letters AB were clearly polymerized onto the surface of the glass slide.

Example 6

A fine tipped plastic disposable pipette was used to handwrite the letters AB onto a glass slide using an ink consisting of the tri-n-butyl borane complexed with 0.6 molar equivalents of isophorone diamine as the catalyst component (ii). Upon dipping the glass slide into a beaker containing a mixture of 10.2 parts of methyl acrylate as component (i), and 4.6 parts of isophorone diisocyanate as component (iii), and removing the substrate from the solution to ambient air, the letters AB were clearly polymerized onto the surface of the glass slide. The polymerized pattern was soft and elastomeric compared to the patterns generated in the previous examples.

Example 7

A fine tipped plastic disposable pipette was used to handwrite the letters AB onto a glass slide using an ink consisting of tri-ethyl borane complexed with 0.7 molar equivalents of aminopropyldiethoxysilyl-terminated copolymer of polydimethylsiloxane and poly(6,6,6,5,5,4,4,3,3 nonfluorohexylmethylsiloxane) having a number average of five dimethylsiloxy units and five 6,6,6,5,5,4,4,3,3 nonfluorohexylmethylsiloxane units per chain as the catalyst component (ii). Upon dipping the glass slide into a beaker containing 6.4 parts of the same siloxane resin as component (i) used in Examples 3 and 4, and 6.3 parts of acrylic acid as component (iii), and removing the substrate from the solution to ambient air, the letters AB were clearly polymerized onto the surface of the glass slide. The same result was obtained when a glass-filled polypropylene substrate was substituted for the glass slide used in this example.

Example 8

The surfaces of the composite articles made from the compositions in Example 2 with polypropylene and polytetrafluoroethylene film substrates, were each overwritten with a black marking dye applied by a fine felt tipped Sharpie® permanent marker. The raised areas where the ink pattern was developed selectively accepted the marking dye, such that the lettering appeared in black, while the black dye on the remaining areas dewetted from the surface and could easily be wiped away from the surface with a laboratory wipe.

Example 9

The method of Example 1 was repeated except that the ink used comprised a catalyst (i) consisting of tris-(trimethylsilylpropyl)borane complexed with 1.2 molar equivalents of 3-aminopropyltriethoxysilane. As in Example 1, the text pattern from the rubber stamp was clearly defined upon removing the patterned polypropylene substrate from the developing bath of acrylic acid to ambient air. The letters were unaffected by heptane washing, and showed excellent adhesion to the polypropylene surface.

Example 10

A fine tipped plastic disposable pipette was used to handwrite the letters AB onto the side wall of a wooden cork ring and a piece of corrugated cardboard using an ink consisting of acrylic acid as components (i) and (iii). The sidewall of the cork ring and the cardboard were each placed lettered-side-down into a polystyrene Petri dish whose bottom was coated with a layer of the developing medium comprised, in this case, of the catalyst (ii) used in Examples 2 and 3. Upon removing the substrates from the solution to ambient air, the letters AB were clearly defined on the surfaces. The patterns were unaffected by washing and drying with heptane. Further evidence of development was demonstrated by the smoke generation from the pattern upon removal of the surfaces from the developing medium due to the heat of polymerization of acrylic acid.

Example 11

An ink was prepared using a catalyst of tri-n-butylborane complexed with 1.4 molar equivalents of isophoronediamine. The composition was transferred in a text pattern onto a clean 75 mm×50 mm×1 mm glass slide using the rubber stamp of Example 1, dipped in the ink of this example, and then applied by hand pressure to the substrate surface. A four ounce round glass jar containing a Teflon-coated magnetic stirrer bar was filled within 2 mm of the brim with acrylic acid, and allowed to stir gently at 250 rpm on a magnetic stirrer at 21° C. The substrate was suspended, patterned side down, over the head space of the acrylic acid, but not directly contacting the liquid by resting the substrate on the brim of the jar. This allowed the pattern to be exposed to acrylic acid vapor. In this example, acrylic acid in the vapor phase served as both components (i) and (iii). When the substrate was lifted after resting 60 seconds on top of the glass jar, the lettering on the rubber stamp had polymerized onto the glass surface. The developed pattern was a solid that could be detected by the fingers as raised lettering. The developed pattern remained unchanged by washing in heptane, giving evidence that the pattern was indeed polymerized onto the surface. This example demonstrates the principle of introducing the developing medium in the vapor phase rather than as a liquid.

Example 12

The procedure used in Example 1 was repeated with the same components, except that the procedure was conducted in a dry, inert glove box with an atmosphere of argon gas containing less than 5 parts per million oxygen. The glove box was a Model HE-43-2-Dri-Lab from the Vacuum Atmosphere Company, Hawthorne, Calif. A fine tipped pipette was used to handwrite the letters AB on the substrate. In about 30 seconds between applying the letters and dipping the substrate into the acrylic acid bath, the ink was observed to de-wet on the polypropylene surface and obscure part of the lettering. After removing the substrate from the acrylic acid bath, the letter B could be easily smeared away with a gloved finger. This indicated that significant development had not yet occurred in the argon atmosphere. The letter A was also broadened slightly by exposure to the acrylic acid, due to the lack of rapid polymerization, but when it was removed from the argon atmosphere and into to ambient air about 30 minutes later, the pattern developed within seconds. This example demonstrates a basic procedure for inert processing that is followed by pattern development by exposure to an oxygen containing atmosphere. The process was repeated on a clean glass slide with similar results but no dewetting was observed.

Example 13

The inert atmosphere process of Example 12 was repeated using an ink containing 0.7 parts by weight of the $M_{0.2}D_{0.2}T^{Methacryloxypropyl}_{0.3}T_{0.3}$ organopolysiloxane resin described in Example 5, 0.7 parts by weight of a methacryloxypropyldimethylsilyl terminated polydimethylsiloxane having a number average molecular weight of 8,220 g/mol, and 0.27 parts by weight of a catalyst of tri-ethylborane complexed with 1.5 molar equivalents of N-(2-aminoethyl)-3-aminopropyltrimethoxysilane. These components were mixed together in a 0.25 ounce polypropylene mixing cup using a Hauschild rotary mixer. A fine tipped pipette was used to handwrite the letters AB on the polypropylene substrate. No dewetting of the pattern was observed over a period of about 30 seconds between handwriting the pattern on the polypropylene surface and dipping it into the acrylic acid. After removing the substrate from the acrylic acid bath, the letter B could be smeared away with a gloved finger. This shows that significant development had not yet occurred in the argon atmosphere. The letter A was broadened slightly by exposure to the acrylic acid without rapid polymerization, however upon removal of the substrate from the argon atmosphere and into ambient air about 30 minutes later, the pattern developed within seconds. This is another demonstration of inert processing followed by pattern development by exposure to an oxygen containing atmosphere. The process was repeated on a glass slide with similar results.

Example 14

In the argon filled glove box used in Example 13, an ink was prepared by combining 2.06 parts by weight of the $M_{0.3}T^{Methacryloxypropyl}_{0.2}T^{Phenyl}_{0.5}$ organopolysiloxane resin used in Example 3, 0.12 parts by weight of a catalyst of tri-n-butyl borane complexed with 1.3 molar equivalents of 3-methoxypropylamine, and 0.14 parts by weight of 3-isocyanatopropyltriethoxysilane. Apparently, due to dissolved oxygen present in the components, the ink eventually thickened to a gel upon mixing. However, it remained sufficiently flowable after mixing by hand, and straight lines could be drawn onto a polypropylene substrate with a fine tipped pipette. No dewetting was observed. Upon removal of the substrate from the argon glove box and into ambient air, the pattern further hardened significantly. This example demonstrates the feasibility of creating a one part ink under inert conditions which can then be developed upon its exposure to an oxygen containing environment.

Example 15

The ink in Example 13 was transferred in a text pattern onto an FR-4 glass fiber reinforced epoxy resin circuit board substrate from Laird Plastics, West Palm Beach, Fla., using the rubber stamp of Example 1 dipped in the ink of this example. The stamp was applied to the surface of the substrate by hand pressure. The text pattern was developed by gently placing the patterned substrate in a Ziploc® bag that contained about 5 grams of a fatty acid lubricated silver flake filler from the American Chemet Corporation, Chicago, Ill. The contents of the bag were then mixed by gently shaking the bag back and forth for about 10 seconds. The substrate was removed from the bag and tapped on a bench top that was covered with a paper towel. The excess silver flake filler powder fell away from the unpatterned areas, but the letters remained coated with the silver filler. The pattern was washed with acetone to remove the excess filler without disturbing the lettering. This indicated that the pattern was developed rapidly in air by contact of the ink with the developing medium, which in this example, was in the form of solid particles bearing component (iii). The procedure was repeated with similar results on a polystyrene Fisher Scientific 08-757-12 Petri dish, a glass slide, and a polypropylene substrate.

Example 16

The ink in this example contained 0.74 parts by weight of tetrahydrofurfuryl methacrylate, 0.72 parts by weight of isooctyl acrylate, a low viscosity, monofunctional monomer which acts as a reactive diluent, of the Sartomer Company Incorporated, Exton Pa., and 0.17 parts by weight of the catalyst of Example 1. The ink components were mixed together in a 0.25 ounce polypropylene mixing cup using a Hauschild rotary mixer. The ink was transferred in a text pattern onto a polypropylene substrate using the rubber stamp of Example 1 dipped in the ink of this example. The stamp was applied to the surface of the substrate by hand pressure. The patterned substrate was developed by shaking it back and forth in a bag containing the fatty acid lubricated silver flake filler as in Example 15. Again, the excess silver flake filler was readily removed from unpatterned areas. The patterned areas were clearly defined with a coating of silver filler. The coating was resistant to washing with heptane.

Examples 15 and 16 demonstrate that the delivery of the amine reactive functionality of component (iii) in a particulate form can be used to rapidly develop patterns under ambient conditions. The use of silver particles to form patterns also suggests that conductive patterns can be deposited on a variety of surfaces by the method of the invention. The procedure lends itself to automation as a fluidized bed process.

Example 17

The patterned substrate in Example 15 was over coated with a 0.020 inch thick layer of the ink used in Example 15, and deposited on the substrate by drawing a film with a doctor blade. The material over the letters selectively hardened into a clear elastomeric gel within minutes to encapsulate the pattern. Excess ink was washed away with acetone. This example shows that when component (iii) is present in a pattern as a conductive solid, activated and/or fluxed by removal of the fatty acid groups, coating with an ink can simultaneously develop and encapsulate the pattern. The example also shows that multi-layer patterns can be readily formed by using the method of the invention.

Example 18

The ink prepared in Example 13 was applied to the rubber stamp used in Example 1, then transferred, by applying the stamp to the surface of a polypropylene substrate by hand pressure. The text pattern was developed by dipping the patterned surface into a Petri dish containing a developing medium that had been prepared by mixing 1.3 parts by weight of polyacrylic acid having an Mw of about 450,000 g/mol from Polysciences Inc., Warrington, Pa., with 49.1 parts by weight of deizonized water. When the polypropylene substrate was removed from the solution to ambient air, the lettering on the rubber stamp was polymerized onto the polypropylene surface. The process was repeated using a glass-filled syndiotactic Questra® WA-552 polystyrene substrate from The Dow Chemical Company, Midland, Mich.; and with an unfilled bisphenol A Hyzod M polycarbonate substrate from the Exotic Rubber & Plastics Corporation, Freeland, Mich.

Example 19

An ink was prepared by mixing (a) 0.03 parts by weight of Williams 1011 carbon black, (b) 0.70 parts by weight of a methacryloxypropyldimethylsilyl terminated polydimethylsiloxane having a number average degree of polymerization of 12,400 g/mol, (c) 0.71 parts by weight of the $M_{0.2}D_{0.2}T^{Methacryloxypropyl}_{0.3}T_{0.3}$ organopolysiloxane resin of Example 5, and (d) 0.28 parts by weight of the organoborane-amine catalyst complex of Example 13, with a Hauschild rotary mixer in a 0.25 ounce polypropylene cup. The ink was transferred in a text pattern using the rubber stamp of Example 1 onto a polypropylene substrate. The ink was developed by placing the substrate in the aqueous developing medium of Example 19. This left a legible pattern with lightly tinted black characters polymerized onto the surface of the polypropylene substrate. Similar results were obtained when the process was repeated with a syndiotactic polystyrene substrate; a Techtron™ brand natural colored polyphenylene sulfide substrate from Boedeker Plastics Inc., Shiner, Tex.; and a Dow Magnum® 555 reground white acrylonitrile-butadiene-styrene (ABS) rubber substrate from The Dow Chemical Company, Midland, Mich.

Example 20

The reservoir of a black inkjet cartridge, i.e., a Model HP 51645A with 42 ml capacity from the Hewlett Packard Company, Palo Alto, Calif. (HP), was drained of black ink, rinsed twenty times with deionized water, and twice with denatured ethanol. After drying overnight, the reservoir was re-filled with about 15 ml of the catalyst used in Example 1. Three injections from a 5 ml disposable syringe were used to re-fill the reservoir, taking care to exclude air bubbles. The reservoir was tightly re-sealed before re-loading the inkjet cartridge into an inkjet printer, i.e., an HP Deskjet 890C, controlled by a personal computer, i.e., HP Vectra VL with Microsoft's Windows 98 software from Microsoft Corporation, Redmond, Wash. A text pattern reading DOW CORNING was created in Times New Roman 12 font size on a simple word processing program, i.e., Microsoft's Notepad, and then printed onto an 8.5"×11" sheet of plastic transparency film, i.e., HP's Premium No. 3824 A inkjet transparency film. The sheet was cut into about 2"×4" strips bordering the text pattern, and then it was dipped into a 100 ml beaker containing a solution of about 50 percent by weight of acrylic acid in heptane. When the film was removed from the solution to the ambient air, the inkjet printed pattern was polymerized onto the polypropylene surface. The developed pattern was a solid, detectable as raised lettering using the fingers. The developed pattern remained unchanged by washing it in heptane, evidencing that the pattern indeed polymerized onto the surface. The developed pattern is shown in the single FIGURE of the drawing.

Other variations may be made in compounds, compositions, and methods described herein without departing from the essential features of the invention. The embodiments of the invention specifically illustrated herein are exemplary only and not intended as limitations on their scope except as defined in the appended claims.

I claim:

1. A method of forming a pattern comprising:
   forming a pattern on a surface with an ink; and
   developing the pattern by exposing the pattern to a developing medium; wherein the ink and the developing medium comprise at least one component selected from (i) a free radical polymerizable monomer, oligomer or polymer, (ii) an organoborane amine complex, (iii) an amine reactive compound, and (iv) oxygen, wherein the components (i)-(iv) are distributed between the ink and the developing medium, such that components (ii) and (iii) are not combined in the presence of component (iv) prior to developing the pattern.

2. A method according to claim 1 in which the pattern is formed and developed at a temperature below 100° C. including room temperature and below room temperature.

3. A method according to claim 1 in which the pattern is developed in ambient air.

4. A method according to claim 1 in which the pattern is formed on the surface by pipetting, manual writing, rubber stamping, elastomeric stamping, pad printing, screen printing, stencil printing, or ink jet printing.

5. A method according to claim 1 in which the surface is a glass surface, a metal surface, a quartz surface, a ceramic surface, a silicon surface, an organic surface, a rigid polymeric surface, a flexible elastomeric surface, a liquid, ice, dry ice, or a composite thereof.

6. A method according to claim 1 in which the organoborane amine complex (ii), the (iii) an amine reactive compound, or both the organoborane amine complex (ii) and the (iii) an amine reactive compound, are attached to solid particles of ground silica, precipitated silica, calcium carbonate, carbon black, carbon nanoparticles, silicon nanoparticles, barium sulfate, titanium dioxide, aluminum oxide, boron nitride, silver, gold, platinum, palladium, nickel, aluminum, copper, or steel.

7. A method according to claim 1 in which the developing medium is a liquid.

8. A method according to claim 1 in which the developing medium is a gas.

9. A method according to claim 1 in which the developing medium is a solid.

10. A method according to claim 1 in which the organoborane-amine complex (ii) is a complex formed between an organoborane and an amine compound, wherein the organoborane is a boron compound containing organic groups of the formula $BR''_3$ where $R''$ is a linear, branched, aliphatic, or aromatic hydrocarbon group containing 1-20 carbon atoms, or an organosilicon-functional boron compound; and the amine compound is an organic amine compound, or an amine-functional organo silicon compound selected from the group consisting of an aminosilane, an amine-functional organosiloxane, an amine-functional organopolysiloxane, or an amine-functional organopolysilsesquioxane.

11. A method according to claim 1 in which (iii) the amine reactive compound is selected from the group consisting of mineral acids, Lewis acids, carboxylic acids, carboxylic acid derivatives, carboxylic acid metal salts, isocyanates, aldehydes, epoxides, acid chlorides, and sulphonyl chlorides.

12. A method according to claim 1 in which (iii) the amine reactive compound is selected from the group consisting of organosilicon, organosiloxane, and organopolysiloxane compounds bearing amine reactive groups, and component (iii) is present as a neat liquid, solvated liquid, solid, or vapor.

13. A method according to claim 1 in which the ink system contains one or more optional components selected from the group consisting of dyes; pigments; surfactants; water; wetting agents; organic solvents; aqueous solvents; ionic liquids; supercritical fluids; diluents; plasticizers; polymers; oligomers; rheology modifiers; adhesion promoters; crosslinking agents; combinations of polymers, crosslinking agents, and catalysts; polymers for extending, softening, reinforcing, toughening, modifying viscosity, and reducing volatility; extending fillers; reinforcing fillers; conductive fillers; spacers; dopants; quantum dots; UV stabilizers; aziridine stabilizers; void reducing agents; hydroquinones; hindered amines; free radical initiators; acid acceptors; antioxidants; heat stabilizers; flame retardants; silylating agents; foam stabilizers; fluxing agents; and desiccants.

14. A surface containing a pattern formed by the method according to claim 1.

15. A method according to claim 1, wherein the ink comprises: (ii) an organoborane amine complex or (iii) an amine reactive compound; and the developing medium comprises: (iii) an amine reactive compound or (ii) an organoborane amine complex; and wherein (i) a free radical polymerizable monomer, oligomer or polymer and (iv) oxygen, are present in the ink or in the developing medium, or in both the ink and the developing medium; and the pattern is developed on the surface by combining a respective ink with its respective developing medium.

16. A method according to claim 1 wherein the ink comprises (i) a free radical polymerizable monomer, oligomer or polymer, (ii) an organoborane amine complex, and (iii) an amine reactive compound in the absence of oxygen, and the developing medium comprises (iv) oxygen.

17. A method according to claim 16 whereby the ink is formed in a pattern on a surface in the absence of oxygen, and the developing medium is ambient air.

18. A method according to claim 1 wherein the ink comprises (i) a free radical polymerizable monomer, oligomer or polymer, and separate phases containing (ii) an organoborane amine complex and (iii) an amine reactive compound, the developing medium comprises (iv) oxygen, and wherein the pattern is developed by allowing components (ii) and (iii) to combine in the developing medium (iv).

19. A method according to claim 18 wherein (ii) an organoborane amine complex, (iii) an amine reactive compound, or both, are encapsulated or carried by a solid phase, and wherein the developing medium additionally comprises a component capable of breaking, softening, melting, swelling, or dissolving the capsule or solid phase, to permit components (ii) and (iii) to combine, or the pattern is subjected to shearing, irradiation, heating, cooling, pressurization, or depressurization, that causes components (ii) and (iii) to combine in the developing medium.

20. A method according to claim 18 wherein the ink comprises an emulsion in which (ii) an organoborane amine complex and (iii) an amine reactive compound are in separate phases of the emulsion, and wherein the developing medium additionally comprises a component capable of disrupting the emulsion to permit components (ii) and (iii) to combine, or the pattern is subjected to shearing, irradiation, heating, cooling, pressurization, or depressurization, that disrupts the emulsion and causes components (ii) and (iii) to combine in the developing medium.

21. The method according to claim 1, wherein the patter is formed and developed by mixing the ink and the developing medium in an ink jet printing process.

\* \* \* \* \*